United States Patent [19]

Williams

[11] Patent Number: 5,151,384
[45] Date of Patent: Sep. 29, 1992

[54] AMORPHOUS SILICON SWITCH WITH FORMING CURRENT CONTROLLED BY CONTACT REGION

[75] Inventor: David M. Williams, Oxon, England

[73] Assignee: Raychem Limited, United Kingdom

[21] Appl. No.: 634,185

[22] PCT Filed: Jul. 13, 1989

[86] PCT No.: PCT/GB89/00797

§ 371 Date: Jan. 14, 1991

§ 102(e) Date: Jan. 14, 1991

[87] PCT Pub. No.: WO90/00817

PCT Pub. Date: Jan. 25, 1990

[30] Foreign Application Priority Data

Jul. 13, 1988 [GB] United Kingdom ............... 8816632

[51] Int. Cl.$^5$ ............................................. H01L 45/00
[52] U.S. Cl. .................................. 437/170; 437/101; 357/2
[58] Field of Search ................. 437/101, 170, 172; 357/2

[56] References Cited

U.S. PATENT DOCUMENTS 3,271,591  9/1966  Ovshinsky ................... 357/2
4,226,898 10/1980  Ovshinsky et al. ........... 357/2
4,665,428  5/1987  Hockley et al. ............... 357/2

FOREIGN PATENT DOCUMENTS 115124   8/1984  European Pat. Off. .
0117045  8/1984  European Pat. Off. .
162529  11/1985  European Pat. Off. .
0196462 10/1986  European Pat. Off. .

OTHER PUBLICATIONS

J App Phys Support 2 pt 1 (1974), pp. 813-815 (Mei et al).

Rep Prog Phys, 33, (1970) pp. 1129-1191 (Stoneham et al).

*Primary Examiner*—William D. Larkins
*Attorney, Agent, or Firm*—Herbert G. Burkard; Timothy H. P. Richardson

[57] ABSTRACT

A method of making an electrical device comprising two electrodes and a body of a switching material formed by reacting amorphous silicon or silicon compound with a passivating agent to remove or reduce the number of unpaired electrons occuring therein. The method includes a forming step in which a forming current is passed through the amorphous silicon layer so as to form an n- or p- doped amorphous silicon layer adjacent to one of the electrodes. The doped silicon layer extends over part only of the device so that the forming current is at most 400 mA. The device exhibits a voltage controlled negative resistance (VCNR) and may be employed for example for transient protection.

10 Claims, 3 Drawing Sheets

AMORPHOUS SILICON SWITCH WITH FORMING CURRENT CONTROLLED BY CONTACT REGION

This invention relates to electrical devices, and in particular to electrical switching devices.

A number of devices have been proposed in the art for switching between high and low resistance states. An amorphous silicon structure that switches from a low resistance to a high resistance state on application of an electrical potential above a given value is described for example by L. Mei and J. E. Greene, J. Appl. Phys Suppt. 2 Pt 1 (1974). However such a structure has the disadvantage that the ratio of the resistivity of the device in its high resistance state to that in its low resistance state is only 7:1, with the result that it would not be possible to form a useful switch for many purposes from such a material.

According to the present invention there is provided a method of producing an electrical device, which comprises:
(a) reacting an amorphous silicon or silicon compound with a passivating agent in order to remove or reduce the number of unpaired electrons occurring in the silicon compound;
(b) providing a first electrode in association with the amorphous silicon compound either before or after step (a);
(c) providing a second electrode in association with the amorphous silicon compound either before or after step (a); and
(d) conducting a "forming" step in which at least part of the amorphous silicon compound layer is restructured by passing an electric current through the device;
the method including the formation of an n- or p- doped amorphous silicon layer which is adjacent to one of the electrodes and extends over part only of the device so that the maximum forming current passing through the device is limited to 400 mA.

The device produced according to the invention has the advantage that the electrical resistance of its high resistance state (or off state) is considerably increased with respect to the resistance of its low resistance state (or on state), with the result that the device may be employed for example as an electrical switch or an electrical fuse that will act as an electrical conductor but will switch to a high resistance state when it is subjected to an overvoltage or over-current. The device according to the invention has been observed to act as a threshold device, that is to say, it will change from a low resistance state to a high resistance state when subjected to a current or voltage above a given value, referred to as the threshold current or threshold voltage, but will remain in its high resistance state only for as long as the applied voltage is greater than a defined minimum value referred to as the holding voltage.

The switching material is preferably formed by reacting amorphous silicon, or an amorphous silicon compound e.g. amorphous silicon carbide, amorphous silicon nitride or amorphous silicon oxide, with the passivating agent, amorphous silicon preferably being employed.

The body of switching material will usually be in the form of a layer, in which case the electrodes may be located on opposite sides of the layer so that electrical current will pass through the layer. This may be achieved by a process in which steps (a) and (b) are conducted simultaneously by depositing a layer of the silicon or silicon compound on the first electrode in the presence of the passivating agent, followed by step (c). This form of device may instead be formed by depositing a layer of amorphous silicon or silicon compound on the first electrode followed by incorporating the passivating agent therein as explained below, and provision of the second electrode.

Alternatively both electrodes may be located on the same side of the layer of switching material so that electrical current will flow along one surface, or at least parallel to the surface, of the layer. This may be achieved by a process in which steps (b) and (c) are conducted simultaneously. The electrodes may be provided after the silicon or silicon compound layer has been formed or passivated, or the silicon or silicon compound layer may be deposited on the electrodes, reaction with the passivating agent being conducted simultaneously or subsequently as described elsewhere. A significant advantage of devices having both electrodes on the same side of the switching layer is that it is relatively easy to alter the electrode-electrode separation without affecting other manufacturing parameters such as the deposition time. It is possible by this means to have electrodes that are relatively widely spaced apart with the result that the off state resistance of the device is considerably increased. In addition the capacitance of the device will be significantly reduced and can be reduced yet further by appropriate choice of electrode configuration.

Although it is possible in all cases to passivate the silicon or silicon compound layer after deposition e.g. by means of a hydrogen plasma or by ion implantation, it is much preferred to passivate the silicon or silicon compound in step (a) simultaneously with deposition of the silicon or silicon compound.

The layer of switching material will normally be formed by a vapour deposition process, e.g. by evaporation, by chemical vapour deposition, plasma deposition or a sputtering process, in which cases the passivating agent may be present in the deposition atmosphere to react with the silicon or silicon compound being deposited. The passivating agent preferably comprises hydrogen or a halogen, more preferably hydrogen or fluorine, and especially hydrogen. In the case of plasma deposition, in which silane or a mixture of silane and a co-reactant e.g. ammonia (for silicon nitride) is employed as the vapour, the hydrogen passivating agent may be formed in situ by decomposition of the silane. Preferably 1 to 25, more preferably 5 to 15 atomic percent hydrogen may be incorporated in the silicon based film in order to remove the so-called "dangling bonds", the term "dangling bonds" as used herein simply being intended to mean unpaired electrons in the silicon atom valence orbitals. The degree to which the silicon atom "dangling bonds" are passivated will depend on the deposition conditions including the deposition pressure, these being chosen so that the number of dangling bonds in the amorphous silicon or silicon compound material is reduced from an original value of about $10^{20}$ $eV^{-1} cm^{-3}$ to $10^{15}$ to $10^{17}$ $eV^{-1} cm^{-3}$. The reduction in the dangling bond density due to passivation will relieve mechanical stress in the rigid tetrahedral structure and will sharply decrease the density of localized states thus decreasing the material's room temperature conductivity by many orders of magnitude. Normally the switching material will have resistivity in the range of $10^9$ to $10^{11}$ ohm cm.

The silicon/hydrogen compound layer may advantageously be formed by depositing silicon by plasma deposition from a silane atmosphere. The silane is fed into a vacuum chamber maintained at a pressure of about 0.1 Torr, and passed between a pair of electrodes one of which may be earthed and the other of which self biases to a high negative potential due to the application of a radio frequency (13.56 MHz) signal. The substrate is located on one of these electrodes (usually the earthed electrode) and the material is deposited on the substrate in its amorphous state. Normally the deposition rate is not greater than 1 um/hr, preferably not more than 0.2 um/hr, preferably not more than 0.1 um/hr, and at an elevated temperature, preferably from 100° to 400° C. and especially from 200° to 300° C. If the layer is deposited too rapidly and/or at too low a temperature or too high a pressure, there is a danger that the hydrogen bonding will be incorrectly configured. Silicon-hydrogen alloys, in contrast to pure amorphous silicon, have much smaller unpaired spin densities and exhibit predominantly band-like conduction rather than variable range hopping conduction among localized states. In addition to changing the conductivity of the layer the silicon hydrogen bond formation allows efficient n or p type doping which is not possible in either evaporated or sputtered pure amorphous silicon.

Alternatively, the materials may be deposited by a sputtering method. In this method predominantly neutral atomic or molecular species are ejected from a target, which may be formed from the material to be deposited, under the bombardment of inert positive ions e.g. argon ions. The high energy species ejected will travel considerable distances to be deposited on the substrate held in a medium vacuum e.g. $10^{-4}$ to $10^{-2}$ mbar. The positive ions required for bombardment may be generated in a glow discharge where the sputtering target serves as the cathode electrode to the glow discharge system. The negative potential (with respect to ground and the glow discharge is maintained in the case of insulating target materials by the use of radio frequency power applied to the cathode, which maintains the target surface at a negative potential throughout the process. DC power may be applied when the target is an electrically conducting material.

In some instances it may be appropriate to employ a reactive bias sputtering method in which reactive gas is introduced into the vacuum chamber in addition to argon so that the oxide or nitride of the target material, which in this case is silicon rather than silicon oxide or nitride, will be deposited. This method may be employed to incorporate the passivating agent in the silicon or silicon compound layer by introducing the appropriate passivating agent gas. The compound forming the insulating layer may be stoichiometric or non-stoichiometric, the particular stoichiometry that is desired being determined inter alia by the quantity of the reactive gas in the vacuum chamber. The partial pressure of reactive gas will normally be between 2 and 30%, preferably up to 25%. As with plasma deposition, and for the same reason, the material is preferably deposited at a rate of not more than 1 micrometer per hour, most preferably not more than 0.2 micrometers per hour and especially about 0.1 micrometer per hour.

After deposition of the amorphous silicon layer, a metallic electrode, e.g. a silver, gold, nickel, molybdenum or chromium electrode is deposited on the switching layer, for example by evaporation e.g. by electron beam evaporation.

After deposition of the second electrode this form of device will exhibit a relatively high electrical resistance, at least up to voltages in the range of 5 to 30 V above which the current increases rapidly with increasing voltage, the particular value of the voltage depending among other things, on the thickness of the layer. After production of the device, it is normally subjected to a so-called "forming" operation in which at least part of the amorphous silicon compound layer is locally restructured by applying a high voltage across the electrodes. It is believed that the forming step causes a disc-like area of crystalline elemental silicon to be formed in the amorphous silicon. The increased temperatures associated with the forming operation cause decomposition e.g. dehydrogenation of any silicon compound to form elemental silicon in the disk-like area together with loss of that part of the electrode that overlies the disc-like area. A small filament is formed through the thickness of the device.

Once the device has been "formed" in this way, it exhibits a voltage controlled negative resistance (VCNR) effect in which it exhibits a low resistance until subjected to a high current or voltage as mentioned above. In contrast with the device described in the prior art, the devices according to the invention can have a ratio of off-state to on-state resistance of at least 50 and preferably at least 100. Devices having an off-state to on-state resistance ratio in the order of 500 and 1000 have been made. The properties exhibited by the devices such as off and on state resistance, threshold voltage etc have been observed to be relatively constant over a large number (5000) transients.

A number of theories have been proposed for the mechanism of the VCNR effect, and are described in Electrical Phenomenon in Amorphous Oxide Films, G. Dearnaley, A. M. Stoneham, D. V. Morgan, Rep. Prog. Phys. (1970), 33 1129-1192. In one such theory, the formed filament is reversably interrupted by current flow through it. In another theory, not mentioned in that reference, the forming of the device generates a conductive crystalline region or filament through the layer, and, as the electric field across the switching layer is increased, the emission of trapped electrons in the amorphous regions increases considerably by the Poole-Frenkel effect, with the result that electrons are drawn out of the conductive, crystalline regions into the considerably larger amorphous regions of the layer (which now has a large proportion of empty electron traps). The reduction of the number of electrons in the conductive crystalline region leads to an increase in the electrical resistance of the filaments which increases yet further with an increase in the applied electric field. In the device according to the invention the VCNR effect may occur through any of these mechanisms or other mechanisms, but is normally associated with local dehydrogenation of the amorphous silicon hydrogen compound, and crystallisation depending on the local forming temperature.

It is believed that the low resistance of the device at low applied voltages is due to ohmic heating of the crystalline silicon region, the crystalline region having a large negative temperature coefficient of electrical resistance (NTC). At higher applied voltages the abrupt reduction in current flowing through the device is associated with thermionic and/or field effect emission of electrons from the crystalline regions, into regions having lower electron mobilities. Thus, according to another aspect, the invention provides an electrical device which comprises a body of an electrically insulating material and a pair of electrodes that are located on the insulating material with at least part of the insulating material between them, the device including at least one region of relatively electrically conducting material (in relation to the insulating material) that is located in the insulating material between the electrodes, the relatively conducting material having a negative temperature co-efficient of electrical resistance (NTC) so that it will heat up due to ohmic heating when a voltage is applied to the device and will emit electrons into surrounding areas, at least at an applied field strength above a threshold value. Preferably at least one of the electrodes has a hole in the region of, and especially substantially coextensive with the region of relatively conducting material. Such a device has the advantage that the relatively conducing material can heat up more quickly under an applied voltage. The relatively conducting material preferably has a coefficient of electrical resistance below (i.e. having a greater negative value than) $-1\%$, preferably below $-2\%$ and especially below $-4\%$ $K^{-1}$.

One problem that is associated with the forming operation is that a relatively high voltage (5 to 30 V) must be applied in order to allow sufficient current to be passed through the device to form it. This has the result that, when the resistance of the silicon layer suddenly decreases, a considerable amount of energy is put into the device. This method of forming is associated with relatively poor devices that have maximum current capacities of 1 uA or so. According to the invention, a layer or area of an n- or p-doped material is provided between the silicon compound layer and one or both of the electrodes. The provision of the n- or p-doped region has the advantage that the forming current can be applied at a much lower voltage e.g. about 1 V, thereby reducing the energy put into the device during forming. Also, the n- or p- doped region may have a relatively small size, e.g., up to $10^{-8}$ $m^2$ and especially not more than $5 \times 10^{-9}$ $m^2$, thereby concentrating the current density into a localized area and allowing forming to occur at lower currents e.g. not more than 400 mA, more preferably not more than 200 and especially not more than 100 mA. Thus the total forming energy can be reduced considerably with consequent reduction in damage to the device, producing devices with more appropriate characteristics such as increased current capacity.

Preferably the switching layer is as described above. Although it is quite possible for the base material (i.e. un-doped) of the n- or p-doped layer to be different from that of the switching layer, it is preferred for them to be the same in which case the n-or p-doped layer can simply be formed by introducing a small quantity of dopant or precursor thereof into the deposition atmosphere during part only of the deposition process. Thus, for example, a small quantity, e.g. 0.1 to 5 volume percent, of phosphine or arsine (or, for p-type doping, diborane or boron trifluoride) may be incorporated into the silane at the start or at the end of the switching material deposition step. The areas over which the doped layer does not extend are masked during the deposition process.

The device according to the invention may be manufactured in any convenient shape or configuration and may be employed as a slow or fast fuse or for electrical transient suppression for example for suppression of transients due to lightning, electrostatic discharge, nuclear electromagnetic pulse and the like. The devices may be manufactured as individual devices, or as pairs of devices or as arrays with more than two devices in each array. For example one common electrode may be provided on one side of the switching layer, and a number of smaller separate electrodes may be provided on the opposite side of the switching layer.

The device according to the invention may be employed alone for protecting an electrical circuit, or it may be employed with one or more additional circuit protection devices, especially a circuit protection device whose impedance reduces when it is subjected to a transient. Such an additional device may for example clamp at a given voltage or may be a so-called "foldback" device that changes from a high resistance state having a typical resistance of 1 Mohm, to a low resistance state of typical resistance 1 to 10 ohms, and may be connected in parallel with the load, with the fuse device according to the invention between them so that the additional device will shunt the transient across the load and, if necessary, protect the device according to the present invention from any overvoltage. Such additional device may comprise a conventional circuit protection device, for example a gas discharge tube, a varistor, Zener diode, or a chalcogenide glass device. Any two or more of such additional devices may be used in combination with the device according to the invention depending on the circuit characteristics and the expected threat.

Several forms of device will now be described by way of example with reference to the accompanying drawings in which.

Figure 1:
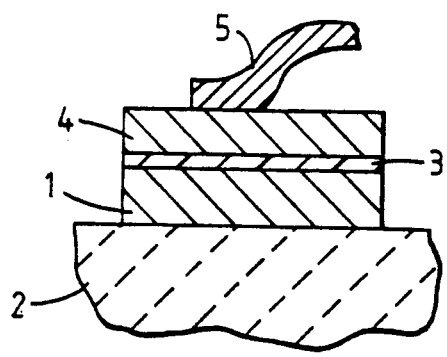
FIG. 1 is a schematic cross-section through one form of device according to the invention.

Referring to the accompanying drawings, FIG. 1 shows a device according to the invention in its simplest form. The device comprises a silver electrode 1 that has been on a conductive base 2, followed by a 300 nm thick layer 3 of intrinsic amorphous silicon that has been reacted with hydrogen to increase the electrical resistance of the silicon to a value of about $10^{10}$ ohm cm. A second silver electrode 4 is provided on the silicon/hydrogen compound layer 3, and a conductor, e.g. a gold wire 5, is bonded to the second electrode.

Figure 2:
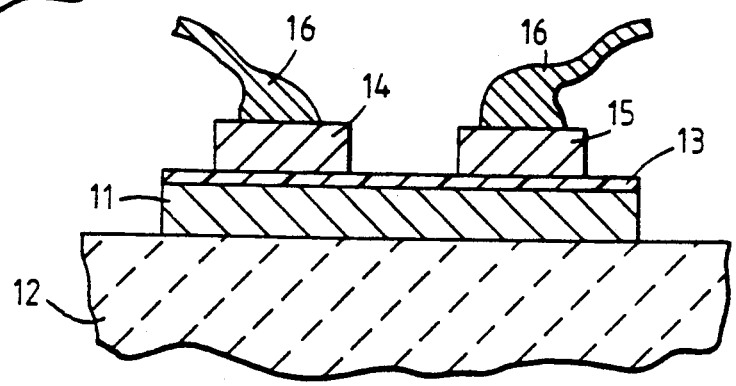
FIG. 2 is a schematic cross-section through another form of device.

FIG. 2 shows an alternative form of device in which a 100 nm thick silver electrode 11 is formed on a ceramic base 12 by evaporation followed by a 300 nm thick layer 13 of an intrinsic amorphous silicon/hydrogen compound and two smaller 100 nm thick silver electrodes 14 and 15. Gold wire connections 16 may be formed on the top silver electrodes in known manner.

The silicon/hydrogen compound layer is formed by depositing silicon by plasma deposition from a silane atmosphere for example under conditions described below.

After deposition of the silicon/hydrogen layer a pair of silver electrodes 14 and 15 are deposited by evaporation. The silicon/hydrogen compound layer of the device shown in FIG. 2 typically has an area in the range of from 1 to 10 mm² and the device has a total thickness in the range of from 300 to 500 um.

Figure 5:
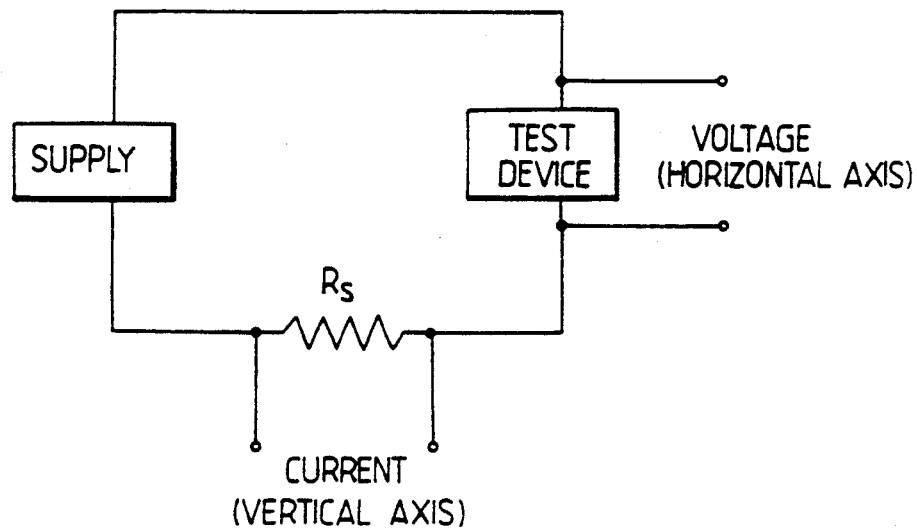
FIG. 5 is a circuit diagram of a forming and test circuit for the device.

After fabrication the device must undergo a forming procedure before the VCNR effect can be observed. The devices can be electrically formed and tested using a Tektronix 370 Programmable Curve Tracer. The system configuration is shown in FIG. 5.

The series resistance $R_s$ (which also acts as a current measuring resistor) can be varied by discrete intervals between a maximum of 12 Mohms with a minimum of 0.36 ohm. During forming high $R_s$ values are chosen and systematically reduced until a sharp change in the device resistance (from high to low) is observed. After this forming step a low $R_s$ (typically 0.36 ohm) is selected for device characterization. The wave forms are digitally acquired at a resolution of 100 points/division on both axes. An averaging facility is available (4 or 32 times) if required to reduce uncorrelated noise and to improve signal-to-noise ratio. A typical unaveraged characteristic is shown in FIG. 5. This shows a device with $R_{on}$ 30 ohms, $R_{off}$ 7 kohms with a bipolar current threshold of 35 mA. The devices always reset to the on condition and reside in this condition until the current threshold is exceeded.

Figure 3:
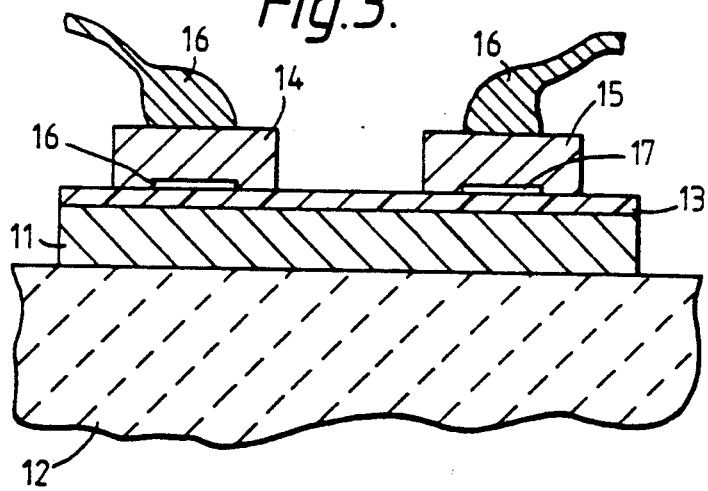
FIG. 3 is a schematic cross-section through yet another form of device.

FIG. 3 shows yet another form of device. This device has the same general construction as that shown in FIG. 2 with the exception that an additional 50 nm thick layer 16 and 17 of n-doped amorphous silicon hydride is located between the layer 13 and each of the electrodes 14 and 15.

The n-doped layers are formed by introducing 1% phosphine into the silane atmosphere used for the production of the main switching layer 13, and masking the layer 13 to delimit the extent of the layers 16 and 17. The top electrodes are then deposited as described with respect to FIG. 2.

Figure 4:
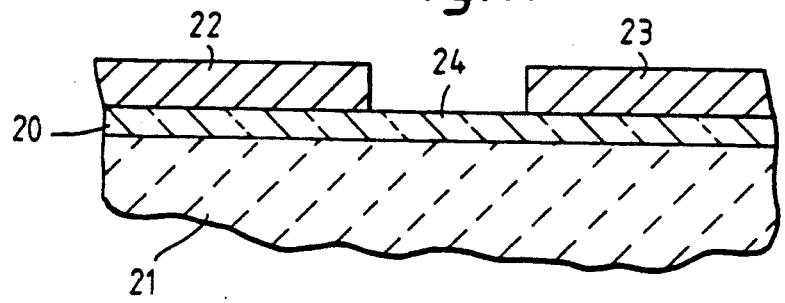
FIG. 4 is a schematic cross-section through a further form of device.

FIG. 4 shows a further form of device according to the invention in which a switching layer 20 has been deposited on a glass or ceramic substrate 21 by plasma deposition from a silane atmosphere as described above. After formation of the layer 20 a pair of electrodes 22 and 23 are deposited on the upper surface 24 of the layer 21 by evaporation. The device is then subjected to the forming operation as described above in order to cause local alteration of the atomic structure of the layer along its surface 24 between the electrodes.

Figure 7:
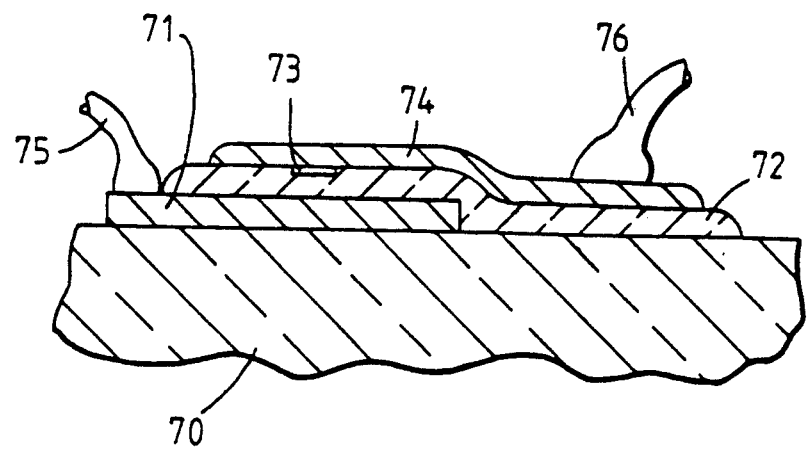
FIG. 7 is a schematic section through yet a further form of device.

FIG. 7 is a schematic section through yet a further form of device in which a lower electrode 71 formed for example from copper or chromium is deposited on a glass body 70 followed by a layer 72 intrinsically semiconducting amorphous silicon so that some of the lower electrode remains exposed and that a region of the semiconducting layer 72 is deposited directly on the glass body 70. A small area 73 of n- or p-doped silicon is then formed in the intrinsically semiconducting layer 72 above the lower electrode, followed by the formation of the electrode 74. The upper electrode 74 extends over the amorphous silicon layer 72 and the n- or p-doped area 73 so that part of the upper electrode overlies the lower electrode 71 and part does not. The exposed part of the lower electrode 71 and the part of the upper electrode not overlying the lower electrode may be used for forming electrical connections, e.g., wire bonds 75 and 76 as shown or as pads for the test probes, without affecting the electrical properties of the device.

The following Examples illustrate the invention:

EXAMPLE 1

A device having the general structure as shown in FIG. 3 but having a single top electrode 14, was prepared by evaporating a 100 nm thick silver electrode 11 onto a glass substrate 12, followed by a 300 nm thick amorphous silicon-hydrogen layer 13. The layer 13 was deposited by plasma deposition at a substrate temperature of 270° C., a pressure of 0.1 Torr and a power of 0.2 W cm⁻², giving a deposition rate of 0.1 nms⁻¹. The deposition atmosphere used was 30% by volume silane 70% by volume helium.

After production of the layer 13, a 50 nm thick, 0.75 mm diameter layer 17 of n-doped silicon was deposited in the same manner as layer 13 but with the addition of 1% phosphine, based on the volume of silane in the deposition feed gas. A 1 mm diameter 100 nm thick layer of silver was then deposited by evaporation.

Figure 6:
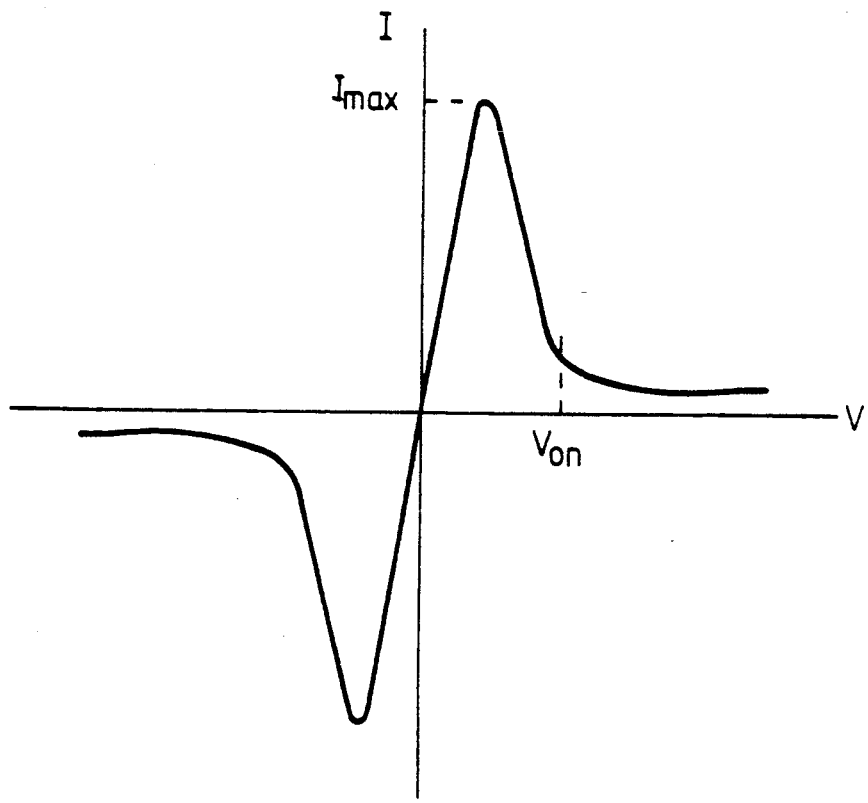
FIG. 6 is a current/voltage curve obtained from a device according to the invention.

The device was tested using the circuit shown in FIG. 5 under the conditions shown below, and, after forming, exhibited a current-voltage trace of the general shape shown in FIG. 6 with the properties given below.

| Forming Conditions/Device Properties | |
|---|---|
| forming current I | 1-10 mA |
| threshold voltage $V_{max}$ | 1 V |
| threshold current $I_{max}$ | 50 mA |
| $R_{on}$ | 10 ohms |
| $R_{off}$ | 10 k ohms |
| $R_{off}/R_{on}$ | 1000 |
| holding voltage $V_{on}$ | 2-5 V |

EXAMPLE 2

Example 1 was repeated with the exception that the electrodes 11 and 14 were formed from evaporated nickel (100 nm thick). The forming conditions and properties of the resulting device were as follows:

| Forming Conditions/Device Properties | |
|---|---|
| Forming current I | 100 mA |
| threshold voltage $V_{max}$ | 1 V |
| threshold current $I_{max}$ | 2 mA |
| $R_{on}$ | 250 ohms |
| $R_{off}$ | 26 k ohms |
| $R_{off}/R_{on}$ | 100 |
| holding voltage $V_{on}$ | 2 V |

EXAMPLE 3

A device of the general form shown in FIG. 7 was formed by evaporating a chromium layer 71 of 200 nm thickness followed by an amorphous silicon layer 72 of 200 nm thickness and a top electrode 74 comprising 50 silver and 150 nm gold. Before depositing the amorphous silicon layer a region of n⁺ doped silicon 73 having a diameter of 50 to 100 nm and a thickness of 25 nm was formed by depositing amorphous silicon and then delimiting its size photolithographically. The device was formed using a 500 mA forming current and a forming voltage of 16 to 25 V. The device had a current/voltage curve as shown in FIG. 8 with the following properties.

| | |
|---|---|
| $V_{max}$ | 2-4 V |
| $I_{max}$ | 30-50 mA |
| $R_{on}$ | 50-70 ohms |
| $R_{off}$ | 5-10 k ohms |
| $R_{off}/R_{on}$ | 100-140 |

I claim:

1. A method of producing an electrical device which comprises:
   (a) reacting an amorphous silicon or silicon compound with a passivating agent in order to remove or reduce the number of unpaired electrons occurring in the silicon compound;
   (b) providing a first electrode in association with the amorphous silicon compound either before or after step (a);
   (c) providing a second electrode in association with the amorphous silicon compound either before or after step (a); and
   (d) conducting a "forming" step in which at least part of the amorphous silicon compound layer is restructured by passing an electric current through the device;
   the method including the formation of an n- or p- doped amorphous silicon layer which is adjacent to one of the electrodes and extends over part only of the device so that the maximum forming current passing through the device is limited to 400 mA.

2. A method as claimed in claim 1, wherein steps (a) and (b) are conducted simultaneously by depositing a layer of the silicon or silicon compound on the first electrode in the presence of the passivating agent, followed by step (c) so that the electrodes are located on opposite sides of the layer.

3. A method as claimed in claim 1, wherein steps (b) and (c) are conducted simultaneously so that both electrodes are located on the same side of the amorphous silicon compound.

4. A method as claimed in claim 3, wherein steps (b) and (c) are conducted after step (a).

5. A method as claimed in claim 1, wherein the amorphous layer is deposited by plasma deposition or reactive sputtering.

6. A method as claimed in claim 1, wherein the forming step is conducted under conditions that limit the maximum current passing through the device to 200 mA.

7. A method as claimed in claim 6, wherein the maximum current is limited by means of a current limiting resistor.

8. A method as claimed in claim 1, wherein the n-doped amorphous silicon compound layer is formed by introducing an n- or p-dopant into the reactant during part only of the deposition step.

9. A method as claimed in claim 1, wherein the passivating agent comprises hydrogen or a halogen.

10. A method as claimed in claim 9, wherein the dopant comprises phosphine, arsine, diborane or boron trifluoride.

* * * * *

UNITED STATES PATENT AND TRADEMARK OFFICE
CERTIFICATE OF CORRECTION

PATENT NO. : 5,151,384
DATED : September 29, 1992
INVENTOR(S) : David M. Williams It is certified that error appears in the above-indentified patent and that said Letters Patent is hereby corrected as shown below:

```
Column 7, line 6, replace "500 um." by --500 nm.--.
Column 8, line 29, in the title for the table at the bottom of
Example 1, replace "Forminq" by --Forming--.
Column 8, lines 59-60, replace "50 silver" by --50 nm silver--.
Column 8, line 62, replace "50 to 100 nm" by --50 to 100 µm--.
```

Signed and Sealed this

Twenty-first Day of December, 1993

Attest:

BRUCE LEHMAN

*Attesting Officer*          *Commissioner of Patents and Trademarks*